(12) United States Patent
Paek et al.

(10) Patent No.: US 11,935,856 B2
(45) Date of Patent: *Mar. 19, 2024

(54) SEMICONDUCTOR DEVICE HAVING A REDISTRIBUTION LAYER

(71) Applicant: Amkor Technology Singapore Holding Pte. Ltd., Singapore (SG)

(72) Inventors: Jong Sik Paek, Incheon (KR); Doo Hyun Park, Seongnam-si (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/352,657

(22) Filed: Jun. 21, 2021

(65) Prior Publication Data

US 2022/0059490 A1  Feb. 24, 2022

Related U.S. Application Data

(63) Continuation of application No. 16/044,164, filed on Jul. 24, 2018, now Pat. No. 11,043,464, which is a
(Continued)

(30) Foreign Application Priority Data

Feb. 4, 2014 (KR) .................. 10-2014-0012762

(51) Int. Cl.
*H01L 23/00* (2006.01)
*H01L 21/56* (2006.01)
(Continued)

(52) U.S. Cl.
CPC .............. *H01L 24/17* (2013.01); *H01L 21/56* (2013.01); *H01L 21/568* (2013.01); *H01L 23/3135* (2013.01); *H01L 24/19* (2013.01);

*H01L 24/85* (2013.01); *H01L 25/105* (2013.01); *H01L 23/5389* (2013.01); *H01L 24/13* (2013.01);
(Continued)

(58) Field of Classification Search
None
See application file for complete search history.

(56) References Cited

U.S. PATENT DOCUMENTS

| 6,740,964 B2 | 5/2004 | Sasaki |
| 8,004,095 B2 | 8/2011 | Shim et al. |

(Continued)

FOREIGN PATENT DOCUMENTS

| KR | 2010-0005-3762 A | 5/2010 |
| KR | 2012-009-4712 A | 8/2012 |
| KR | 10-2013-0052179 A | 5/2013 |

OTHER PUBLICATIONS

Zohni, Wael (Invensas Corporation), Ultra high-bandwidth PoP infrastructure development, Nov.-Dec. 2013, 4 pages.
(Continued)

*Primary Examiner* — J. E. Schoenholtz
(74) *Attorney, Agent, or Firm* — McAndrews, Held & Malloy, Ltd.

(57) ABSTRACT

A semiconductor device and manufacturing method thereof. Various aspects of the disclosure may, for example, comprise forming a back end of line layer on a dummy substrate, completing at least a first portion of an assembly, and removing the dummy substrate.

14 Claims, 4 Drawing Sheets

Related U.S. Application Data continuation of application No. 15/340,785, filed on Nov. 1, 2016, now Pat. No. 10,032,740, which is a continuation of application No. 14/313,724, filed on Jun. 24, 2014, now Pat. No. 9,484,331.

(51) Int. Cl.
   *H01L 23/31* (2006.01)
   *H01L 23/538* (2006.01)
   *H01L 25/10* (2006.01)

(52) U.S. Cl.
   CPC .............. *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/13147* (2013.01); *H01L 2224/16225* (2013.01); *H01L 2224/32225* (2013.01); *H01L 2224/45099* (2013.01); *H01L 2224/48091* (2013.01); *H01L 2224/48227* (2013.01); *H01L 2224/73204* (2013.01); *H01L 2224/73253* (2013.01); *H01L 2224/73267* (2013.01); *H01L 2224/81005* (2013.01); *H01L 2224/81203* (2013.01); *H01L 2224/81815* (2013.01); *H01L 2224/85* (2013.01); *H01L 2224/92125* (2013.01); *H01L 2225/1011* (2013.01); *H01L 2225/1023* (2013.01); *H01L 2225/1035* (2013.01); *H01L 2225/1041* (2013.01); *H01L 2225/1058* (2013.01); *H01L 2225/107* (2013.01); *H01L 2924/00012* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/18161* (2013.01); *H01L 2924/18162* (2013.01); *H01L 2924/19107* (2013.01); *H01L 2924/3511* (2013.01)

(56) References Cited

U.S. PATENT DOCUMENTS

| | | | |
|---|---|---|---|
| 9,064,718 | B1 | 6/2015 | Muniandy et al. |
| 9,484,331 | B2 | 11/2016 | Paek et al. |
| 10,163,867 | B2 | 12/2018 | Kim et al. |
| 10,269,586 | B2 * | 4/2019 | Chou ................. H01L 24/19 |
| 11,043,464 | B2 * | 6/2021 | Paek .................. H01L 21/56 |
| 11,069,573 | B2 * | 7/2021 | Yu ..................... H01L 21/568 |
| 2005/0035464 | A1 | 2/2005 | Ho |
| 2007/0069389 | A1 | 3/2007 | Wollanke et al. |
| 2009/0008765 | A1 | 1/2009 | Yamano et al. |
| 2009/0085201 | A1 | 4/2009 | Mathew |
| 2009/0140442 | A1 | 6/2009 | Lin |
| 2010/0140772 | A1 | 6/2010 | Lin et al. |
| 2011/0068427 | A1 * | 3/2011 | Paek ................. H01L 24/20 257/E21.705 |
| 2011/0089552 | A1 * | 4/2011 | Park .................. H01L 21/568 438/109 |
| 2011/0254156 | A1 | 10/2011 | Lin |
| 2012/0056329 | A1 | 3/2012 | Pagaila et al. |
| 2012/0211885 | A1 | 8/2012 | Choi |
| 2012/0268899 | A1 | 10/2012 | Haba et al. |
| 2013/0062761 | A1 | 3/2013 | Lin |
| 2013/0113098 | A1 * | 5/2013 | Hwang ............ H01L 21/4857 438/106 |
| 2013/0168849 | A1 | 7/2013 | Scanlan |
| 2014/0063768 | A1 * | 3/2014 | Tanaka .............. H05K 1/185 29/830 |
| 2014/0091473 | A1 | 4/2014 | Len et al. |
| 2014/0103488 | A1 * | 4/2014 | Chen ................. H01L 24/19 257/532 |
| 2014/0217604 | A1 * | 8/2014 | Chou ................ H01L 23/5389 257/774 |
| 2014/0217619 | A1 | 8/2014 | Zhao et al. |
| 2014/0246779 | A1 | 9/2014 | Lin et al. |
| 2014/0264933 | A1 | 9/2014 | Yu et al. |
| 2014/0319661 | A1 | 10/2014 | Pagaila |
| 2014/0367850 | A1 | 12/2014 | Wang et al. |
| 2015/0044819 | A1 | 2/2015 | Lin |
| 2015/0102484 | A1 | 4/2015 | Chen et al. |
| 2015/0132889 | A1 * | 5/2015 | Yu ..................... H01L 25/50 438/107 |
| 2015/0155203 | A1 | 6/2015 | Chen |
| 2015/0162205 | A1 | 6/2015 | Chou |
| 2015/0187743 | A1 * | 7/2015 | Yu ..................... H01L 25/105 257/774 |
| 2015/0194388 | A1 | 7/2015 | Pabst |
| 2015/0221573 | A1 | 8/2015 | Paek et al. |
| 2016/0172334 | A1 * | 6/2016 | Hsu .................... H01L 24/19 257/692 |
| 2017/0243839 | A1 | 8/2017 | Buckalew et al. |
| 2018/0047709 | A1 * | 2/2018 | Yu ................... H01L 23/49894 |
| 2021/0320067 | A1 * | 10/2021 | Kim ................. H01L 23/49838 |

OTHER PUBLICATIONS

Invensas™ BVA PoP for Mobile Computing: Untra-High IO withoug TSVs, Jun. 26, 2012, 4 pages.

Fillion, Ray, Advanced Packaging Technology for Leading Edge Microelectronics and Flexible Electronics, MSE 542 Cornell University, Feb. 3, 2016.

Rao, Vempati Srinivasa et al., Process and Reliability of Large Fan-Out Wafer Level Package Based Package-on-Package, 2017 IEEE 67th Electronic Components and Technology Conference (ECTC), 2017.

FO-WLP, Embedded Die, and Alternatives: Market Trends and Drivers, Tech Search 2016, May 25, 2019.

Nishitani, Y., Coreless Packaging Technology for High Performance Applications, 62nd Electronic Components and Technology Conference, 2012, May 29-Jun. 1, San Diego, 2012.

* cited by examiner

SEMICONDUCTOR DEVICE HAVING A REDISTRIBUTION LAYER

CROSS-REFERENCE TO RELATED APPLICATION/INCORPORATION BY REFERENCE

The present application is a continuation of U.S. patent application Ser. No. 16/044,164, filed Jul. 24, 2018, and titled "SEMICONDUCTOR DEVICE HAVING UPPER AND LOWER REDISTRIBUTION LAYERS," expected to issue as U.S. Pat. No. 11,043,464; which is a continuation of U.S. patent application Ser. No. 15/340,785, filed Nov. 1, 2016, titled "SEMICONDUCTOR DEVICE AND MANUFACTURING METHOD THEREOF," now U.S. Pat. No. 10,032,740; which is a continuation of U.S. patent application Ser. No. 14/313,724; titled "SEMICONDUCTOR DEVICE AND MANUFACTURING METHOD THEREOF," filed Jun. 24, 2014, now U.S. Pat. No. 9,484,331; which makes reference to, claims priority to, and claims the benefit of Korean Patent Application No. 10-2014-0012762, filed on Feb. 4, 2014. Each of the above-mentioned applications is hereby incorporated herein by reference in its entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present semiconductor devices and/or manufacturing methods are inadequate, for example resulting in excessively thick, warped, and expensive components. Further limitations and disadvantages of conventional and traditional approaches will become apparent to one of skill in the art, through comparison of such approaches with the various aspects of the present disclosure as set forth in the remainder of the present application with reference to the drawings.

DETAILED DESCRIPTION

The following discussion presents various aspects of the present disclosure by providing various examples thereof. Such examples are non-limiting, and thus the scope of various aspects of the present disclosure should not necessarily be limited by any particular characteristics of the provided examples.

As utilized herein, the phrases "for example" and "e.g." are non-limiting and are generally synonymous with "by way of example and not limitation," "for example and not limitation," and the like. Similarly, as utilized herein, the term "exemplary" means serving as a non-limiting example, instance, or illustration.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, the phrases "operates to" and "is operable to" describe functionality performed by particular hardware, comprising hardware operating in accordance with software instructions. The phrases "operates to" and "is operable to" include "operates when enabled to". For example, a module that operates to perform a particular operation, but only after receiving a signal to enable such operation, is included by the phrase "operates to."

The terminology used herein is for the purpose of describing particular example embodiments only and is not intended to be limiting of the disclosure. As used herein, the singular forms are intended to include the plural forms as well, unless the context clearly indicates otherwise. It will be further understood that the terms "include," "comprise," "including," and/or "comprising," when used in this specification, specify the presence of stated features, integers, steps, operations, elements, and/or components, but do not preclude the presence or addition of one or more other features, integers, steps, operations, elements, components, and/or groups thereof. In other words, such terms are generally described as being open-ended.

It will be understood that, although the terms first, second, etc. may be used herein to describe various elements, components, regions, layers and/or sections, these elements should not be limited by these terms. These terms are only used to distinguish one element from another element, component, region, layer and/or section. Thus, for example, a first element, a first component, a first region, a first layer and/or a first section discussed below could be termed a second element, a second component, a second region, a second layer and/or a second section without departing from the teachings of the present disclosure.

Various aspects of the present disclosure provide a manufacturing method of a semiconductor device that is thin while retaining excellent electrical properties and experiences reduced warpage due to non-use of a printed circuit board (PCB), and a semiconductor device produced by such manufacturing method.

Various aspects of the present disclosure also provide a manufacturing method of a semiconductor device, which can be manufactured at a reduced cost due to non-use of a printed circuit board (PCB), and a semiconductor device produced by such manufacturing method.

In accordance with various aspects of the present invention, there is provided a manufacturing method of a semiconductor device, comprising forming a back end of line (BEOL) layer on a dummy substrate, electrically connecting a semiconductor die to the BEOL layer, firstly encapsulating the BEOL layer and the semiconductor die using a first encapsulant, removing the dummy substrate from the BEOL layer, electrically connecting a solder ball to the BEOL layer, secondly encapsulating the BEOL layer and the solder ball using a second encapsulant, and electrically connecting a semiconductor package to the BEOL layer.

The dummy substrate may, for example, comprise silicon, glass, silicon carbide, sapphire, quartz, ceramic, metal oxide or a metal. The semiconductor package may, for example, be electrically connected to the BEOL layer by a conductive pillar (e.g., formed by plating; formed with a wire, for example a free-standing wire bond wire; etc.) passing through the first encapsulant. The semiconductor die may, for example, be bonded to the BEOL layer using flip chip technology. The solder ball may, for example, be exposed to the outside through the second encapsulant.

The manufacturing method may, for example, further comprise forming a redistribution layer in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer.

The forming of the BEOL layer may, for example, comprise forming a dielectric layer having an opening in the dummy substrate, and forming a redistribution layer and a conductive pillar in the dielectric layer. The removing of the dummy substrate may, for example, comprise grinding the dummy substrate, and etching the dummy substrate.

In accordance with various aspects of the present invention, there may be provided a semiconductor device comprising a back end of line (BEOL) layer, a semiconductor die electrically connected to the BEOL layer, a first encapsulant that firstly encapsulates the BEOL layer and the semiconductor die, a solder ball electrically connected to the BEOL layer, a second encapsulant that secondly encapsulates the BEOL layer and the solder ball, and a semiconductor package electrically connected to the BEOL layer.

The semiconductor package may, for example, be electrically connected to the BEOL layer by a conductive pillar passing through the first encapsulant. The semiconductor die may, for example, be bonded to the BEOL layer using flip chip technology. The solder ball may, for example, be exposed to the outside through the second encapsulant.

The semiconductor device may further comprise a redistribution layer formed in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer. The BEOL layer may, for example, comprise a dielectric layer, and a redistribution layer and a conductive pillar formed in the dielectric layer.

As described above, in an example manufacturing method of a semiconductor device and an example semiconductor device produced by such a manufacturing method, according to various aspects of the present disclosure, since a printed circuit board (PCB) might not be used, the semiconductor device may be thin, retain excellent electrical properties, and experience reduced warpage.

In addition, in an example manufacturing method of a semiconductor device and an example semiconductor device produced by such a manufacturing method, according to various aspects of the present disclosure, since a printed circuit board (PCB) might not be used, the semiconductor device may be manufactured at a reduced cost, for example relative to a semiconductor device having a PCB.

Various aspects of the present disclosure may be best understood by reference to the following detailed description when read in conjunction with the accompanying drawings.

Hereinafter, various aspects of the present disclosure will be described with reference to FIGS. 1a to 3. Example embodiments of various aspects of the present disclosure will now be described more fully hereinafter with reference to the accompanying drawings; however, such aspects may be embodied in different forms and should not be construed as being limited by characteristics of the example embodiments set forth herein. In the drawing figures, the dimensions of layers and regions may be exaggerated and/or diminished for clarity of illustration. Like reference numerals may generally refer to like elements throughout.

FIGS. 1a to 1j show cross-sectional views of an example semiconductor device at various stages of processing, in accordance with various aspects of the disclosure. Such cross-sectional views may, for example, illustrate various aspects of an example manufacturing method of a semiconductor device in accordance with the present disclosure.

Figure 1A:
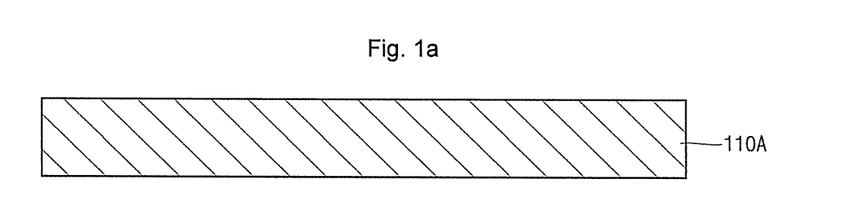
FIGS. 1a to 1j show cross-sectional views of an example semiconductor device at various stages of processing, in accordance with various aspects of the disclosure.

As illustrated by example, in FIG. 1a, a dummy substrate 110A may be prepared, the dummy substrate 110A comprising, for example, a substantially planar top surface and a substantially planar bottom surface. The dummy substrate 110A may, for example, comprise a material comprising silicon, low-grade silicon, glass, silicon carbide, sapphire, quartz, ceramic, metal oxide, a metal or equivalents thereof, etc., but aspects of the present disclosure are not limited thereto.

Next, an example method of forming a back end of line (BEOL) layer 110 on the dummy substrate 110A will be described. In some cases, the BEOL layer 110 may, for example, be the same with and/or comprise a redistribution layer.

Figure 1B:
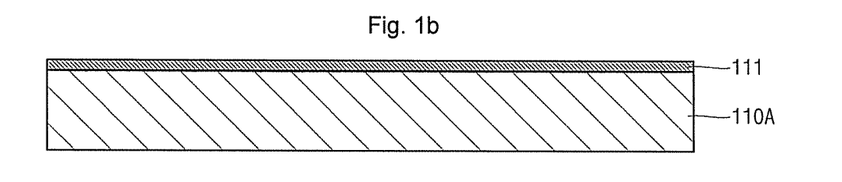

As illustrated by example in FIG. 1b, a dielectric layer 111 may be first deposited on the dummy substrate 110A (e.g., by a chemical vapor deposition (CVD) device), and an opening 111a (or one or more openings) may be formed (e.g., by a photolithography process and/or a laser process). A top surface of the dummy substrate 110A may, for example, be directly exposed to the outside by the opening 111a.

Here, for example, the dielectric layer 111 may be or comprise a material comprising a silicon oxide layer, a silicon nitride layer or equivalents thereof, etc., but aspects of the present disclosure are not limited thereto.

Figure 1C:
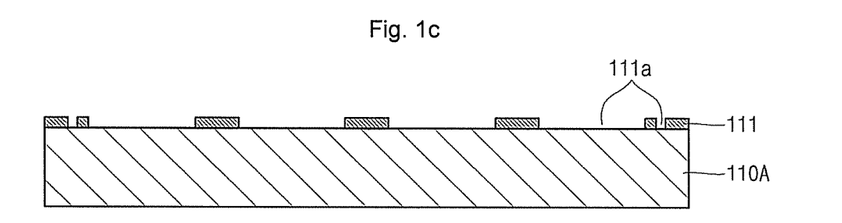

As illustrated by example in FIG. 1c, a redistribution layer 112 may be formed in the opening 111a and on the dielectric layer 111. For example, the redistribution layer 112 may be brought into direct contact with the dummy substrate 110A through the opening(s) 111a. The redistribution layer 112 may, for example, be formed by an electroless plating process for a seed layer using gold, silver, nickel, titanium and/or tungsten, an electroplating process using copper, etc., and/or a photolithography process using photoresist, but aspects of the present disclosure are not limited thereto.

In addition, the redistribution layer 112 may, for example, comprise copper, a copper alloy, aluminum, an aluminum alloy, iron, an iron alloy, or equivalents thereof, etc., but aspects of the present disclosure are not limited thereto.

The forming of the dielectric layer 111 and the forming of the redistribution layer 112 may, for example, be repeatedly performed multiple times, for example forming the BEOL layer 110 having a multi-layered structure.

As described above, the BEOL layer 110 might, for example, comprise only a dielectric layer and a redistribution layer but need not comprise an organic core layer or an organic build-up layer, like in a conventional PCB (e.g., a rigid PCB or a flexible PCB). Therefore, the redistribution layer may be formed thinly (e.g., to have a considerable small thickness). For example, the redistribution layer 112 may have a thickness of 10 μm or less. By contrast, a conventional PCB is generally formed to have a thickness of 200 μm to 300 μm.

In addition, as described above, since the BEOL layer 110 may be formed by a fabrication (FAB) process, the redistribution layer 112 may be formed to have a width, thickness and/or pitch in a range of 20 nm to 1000 nm.

Therefore, various aspects of the present disclosure provide a considerably fine redistribution layer 112, for example accommodating highly integrated semiconductor dies. By contrast, the redistribution layer of a conventional PCB is generally formed to have a width, thickness and/or pitch in a range of 20 μm to 30 μm.

In the BEOL layer 110, all or some regions of the redistribution layer 112 may be directly exposed to the outside. A conductive pillar 113, to be described later, may be formed on (e.g., directly on) exposed regions of the redistribution layer 112, and a semiconductor die 120 may be connected to (e.g., directly connected to) exposed regions of redistribution layer 112.

Figure 1D:
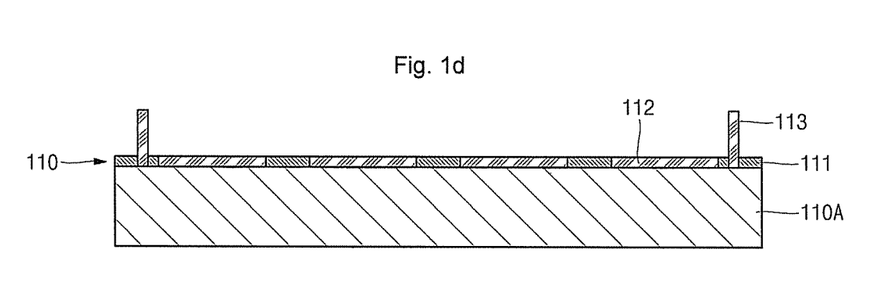

As illustrated by example in FIG. 1d, a conductive pillar 113 (or a plurality thereof) may be formed on (e.g., directly on) the redistribution layer 112, for example to be electrically connected to the semiconductor package 140 to be described later. Here, for example, the conductive pillar 113 may be or comprise a material comprising copper, a copper alloy, aluminum, an aluminum alloy, iron, an iron alloy, or equivalents thereof, etc., but aspects of the present disclosure are not limited thereto.

In addition, since the conductive pillar (or post) 113 may, for example, be generally formed by a general plating process, by a photolithography process, from a narrow free-standing wire (e.g., a wire-bond wire) bonded to the redistribution layer 112, etc., it may be formed to have a width smaller than approximately 50 μm. Therefore, a considerably fine conductive pillar 113 may be formed, for example compared to the conventional art. In an example, the conductive pillar 113 may allow the semiconductor package 140 to accommodate approximately 400 or more input/output terminals. In a comparative example, a solder ball formed on the conventional BEOL layer may be formed to have a diameter of approximately 200 μm or greater.

In addition, since the conductive pillar 113 may be electrically connected to the semiconductor package 140 positioned relatively far from the conductive pillar 113, the conductive pillar 113 may be formed to have a height equal to or greater than a height of the semiconductor die 120 to be described later.

In the illustrated embodiment, the conductive pillar 113 and the redistribution layer 112 are separated from each other, but they may be electrically connected to each other in practice.

Figure 1E:
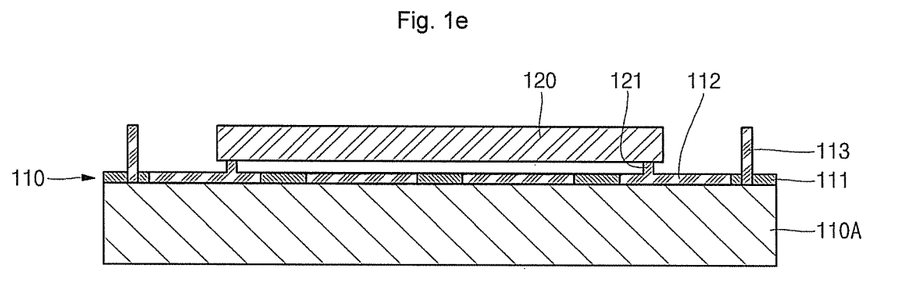

As illustrated by example in FIG. 1e, the semiconductor die 120 may be electrically connected to the BEOL layer 110. For example, a bonding pad, a copper pillar, or a bump 121 of the semiconductor die 120 may be electrically connected to the BEOL layer 110. In addition, the semiconductor die 120 may be electrically connected to the BEOL layer 110 using flip-chip technology.

The connection of the semiconductor die 120 may, for example, be achieved by a general thermal compression process, a mass reflow process and/or an equivalent thereof, etc., but aspects of the present disclosure are not limited thereto.

Here, for example, the semiconductor die 120 may have a thickness of approximately 50 μm to 70 μm, but aspects of the present disclosure are not limited thereto.

As discussed above, the conductive pillar 113 may have a height greater than or equal to the height of the semiconductor die 120. In various examples, however, the height of the conductive pillar 113 may also be smaller than the height of the semiconductor die.

An underfill (not shown) may, for example, be injected into a space between the semiconductor die 120 and the BEOL layer 110, followed by curing. The underfill may, for example, make the semiconductor die 120 more stably fixed on the BEOL layer 110. Even if, for example, there is a difference in respective thermal expansion coefficients between the semiconductor die 120 and the BEOL layer 110, the semiconductor die 120 and the BEOL layer 110 are not electrically disconnected from each other.

In various examples, if the first encapsulant 130 to be described later is viscous enough to flow into a gap between the semiconductor die 120 and the BEOL layer 110, since the first encapsulant 130 may be directly filled in the gap between the semiconductor die 120 and the BEOL layer 110, the underfill might not be utilized.

Figure 1F:
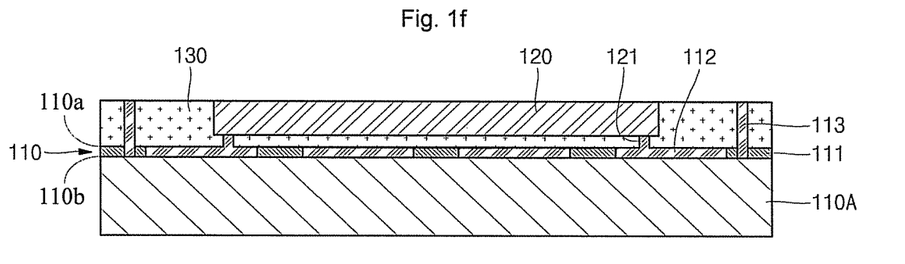

As illustrated by example in FIG. 1f, the semiconductor die 120 and the conductive pillar 113 formed on the BEOL layer 110 may be firstly encapsulated by the first encapsulant 130. Therefore, the semiconductor die 120 and the conductive pillar 113 may be additionally protected from external surroundings. Here, the first encapsulant 130 may be brought into close contact with the BEOL layer 110 and may completely encapsulate the semiconductor die 120 or may expose a top surface of the semiconductor die 120 (e.g., with or without thinning or grinding).

The encapsulating may, for example, be achieved by a general transfer molding process, a compression process, an injection molding process and an equivalent thereof, etc., but aspects of the present disclosure are not limited thereto.

The first encapsulant 130 may, for example be or comprise a material selected from; a general epoxy, a film, a paste and equivalents thereof, etc., but aspects of the present disclosure are not limited thereto. For example, the BEOL layer 110, the semiconductor die 120 and the conductive pillar 113 may be cohesively integrated with each other by the first encapsulant 130.

After the first encapsulating, a grinding process may further be performed. In the grinding process, for example, the first encapsulant 130 and the semiconductor die 120 may be subjected to the grinding process (e.g., by or to a predetermined thickness), thereby reducing the thickness of the semiconductor device and/or encapsulant.

Figure 1G:
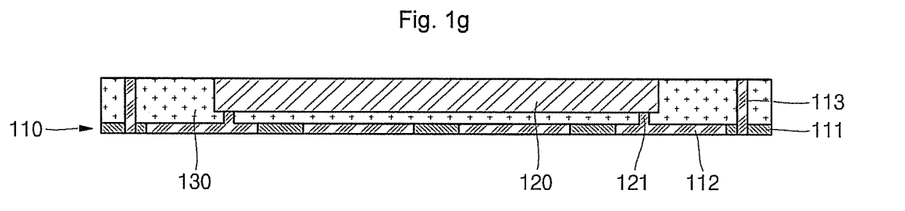

As illustrated by example in FIG. 1g, the dummy substrate 110A may be removed from the BEOL layer 110. For example, the first encapsulant 130 may be held by a wafer support system. Then, the dummy substrate 110A may be removed, for example, to a predetermined thickness through a grinding process, and then completely removed by a dry and/or wet etching process.

For example, a region (e.g., a bottom surface) of the redistribution layer 112 of the BEOL layer 110 may be exposed to the outside through the dielectric layer 111. For example, a seed layer (using, for example, gold, silver, nickel, titanium and/or tungsten) may be directly exposed to the outside through the dielectric layer 111. Preferably, gold and/or silver may be directly exposed to the outside through the dielectric layer 111 to, for example, facilitate connection with a conductive ball (e.g., a solder ball) or another semiconductor device in a subsequent process.

Figure 1H:
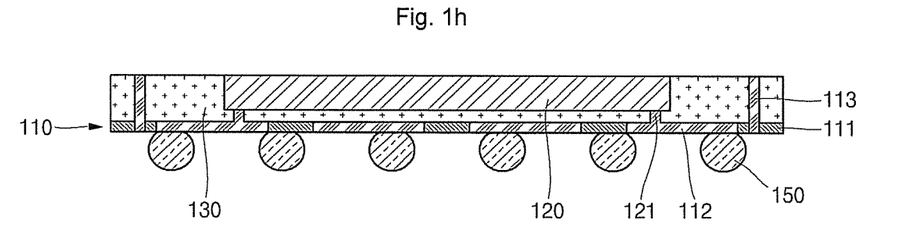

As illustrated by example in FIG. 1h, the solder ball 150 may be connected to the redistribution layer 112 exposed to the outside (e.g., the bottom) through the dielectric layer 111. For example, a volatile flux may be coated on a predetermined region of the redistribution layer 112 exposed to the outside (the bottom) through the dielectric layer 111, and the solder ball 150 may be positioned on the flux, followed by applying heating to a temperature of approximately 130° C. to 250° C., thereby making the flux volatilize and connecting the solder ball 150 to a predetermined region of the redistribution layer 112. Thereafter, a cooling process may be performed to solidify the solder ball 150 and complete the mechanically/electrically connection to the redistribution layer 112.

Figure 1I:
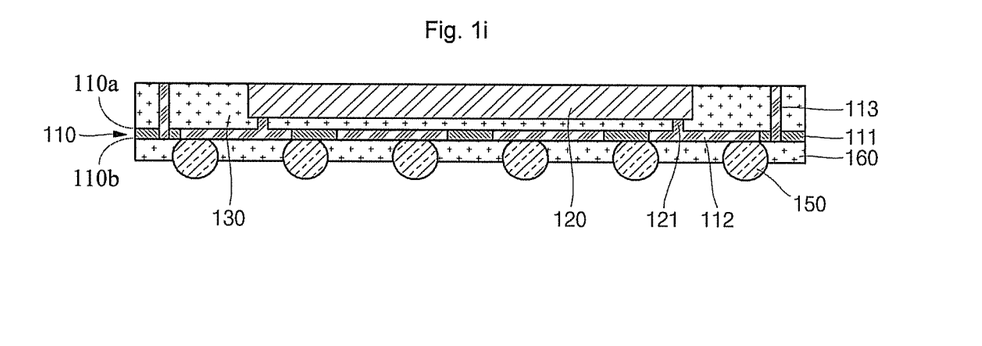

As illustrated by example in FIG. 1i, the BEOL layer 110 and the solder ball 150 may be secondly encapsulated using a second encapsulant 160. For example, the second encapsulant 160 may cover not only the dielectric layer 111 and the redistribution layer 112 of the BEOL layer 110 but also a region (a lateral region) of the solder ball 150. Here, for example, the solder ball 150 may be exposed to the outside (e.g., the bottom) through the second encapsulant 160.

In another example, after the BEOL layer 110 is secondly encapsulated using the second encapsulant 160, the solder ball 150 may be electrically connected to the BEOL layer 110, for example through and/or through openings in the second encapsulant. For example, during the second encapsulating, a region of the redistribution layer 112 forming the BEOL layer 110 may be exposed to the outside (e.g., the bottom).

Figure 1J:
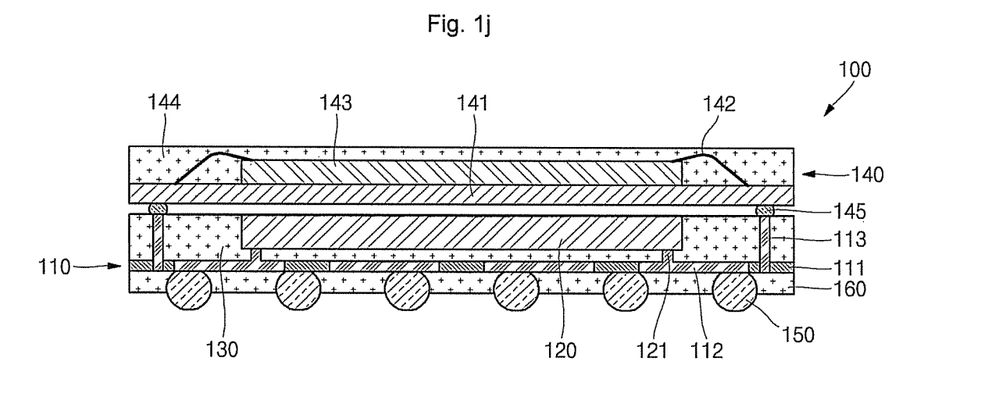

As illustrated by example in FIG. 1j, the semiconductor package 140 may be electrically connected to the BEOL layer 110. For example, the semiconductor package 140, comprising a substrate 141, a semiconductor die 143 bonded to the substrate 141 (e.g., by a conductive wire 142 or in a flip-chip configuration), and an encapsulant 144 encapsulating the substrate 141 and the semiconductor die 143, may be connected to the solder bump (or ball) 145 and the conductive pillar 113, thereby electrically connecting the semiconductor package 140 to the BEOL layer 110.

For example, the semiconductor die 120 may be an AP (processor) and the semiconductor die 143 may be an LPDDR (memory), but aspects of the present disclosure are not limited thereto.

As described above, since the conventional PCB is not used, various aspects of the present disclosure provide the semiconductor device 100 having a small thickness and excellent electrical properties while suppressing warpage. For example, the semiconductor device 100 having a thickness of approximately 100 µm to 200 µm may be provided using a BEOL layer having a thickness of approximately 10 µm or less. In addition, the semiconductor device 100 having excellent electrical properties (e.g., having a relatively small power loss and/or having relatively low susceptibility to noise) is provided by the redistribution layer having a width, thickness and/or pitch in a range of 20 nm to 30 nm. Further, since the dielectric layer included in the BEOL layer may be made of an inorganic material, it has a thermal expansion coefficient similar to (or the same as) that of each of the semiconductor die 120 and the first and second encapsulants 130 and 160, thereby providing a semiconductor device 100 that is substantially less susceptible to warpage.

In addition, since top and bottom surfaces of the BEOL layer 110 may be surrounded by the first and second encapsulants 130 and 160, the BEOL layer 110 can be protected from external surroundings.

Further, according to various aspects of the present disclosure, the BEOL layer may be formed using existing deposition equipment, plating equipment or photolithography equipment without having to purchase the conventional high-priced PCB, thereby providing the semiconductor device 100 at a reduced manufacturing cost.

The previous discussion provided a non-limiting example of a method for producing a semiconductor device, and a semiconductor device produced by such method, in accordance with various aspects of the present disclosure. Additional examples will now be provided and discussed with regard to FIG. 2 and FIG. 3.

Figure 2:
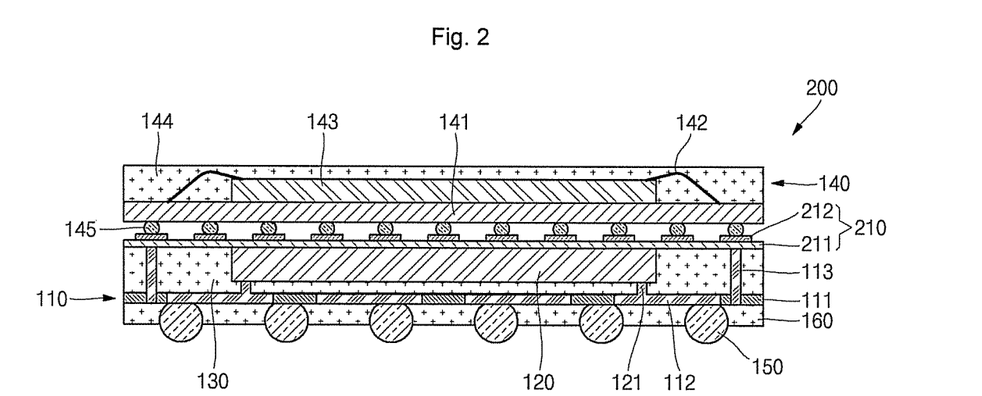
FIG. 2 shows a cross-sectional view of an example semiconductor device, in accordance with various aspects of the disclosure.

FIG. 2 shows a cross-sectional view of an example semiconductor device (200) in accordance with various aspects of the disclosure. The example semiconductor device 200 may share any or all characteristics with the example semiconductor device 100 shown in various stages in FIGS. 1a-1j.

As illustrated in FIG. 2, the semiconductor device 200 may comprise a redistribution layer 210 formed on a surface of the first encapsulant 130 to be electrically connected to the BEOL layer 110. In addition, the semiconductor package 140 may be electrically connected to the redistribution layer 210.

For example, the redistribution layer 210 may be electrically connected to the BEOL layer 110 through the conductive pillar 113. In addition, the redistribution layer 210 may comprise a dielectric layer 211 formed on the surface of the first encapsulant 130 using, for example, polyimide or polyamide, and a redistribution layer 212 formed on a surface of the dielectric layer 211 using, for example, copper or a copper alloy.

As described above, in the illustrated example semiconductor device 200, the redistribution layer 210 may be additionally used, thereby accommodating a large number of input/output terminals in the semiconductor package 140 and placement flexibility for such terminals.

Figure 3:
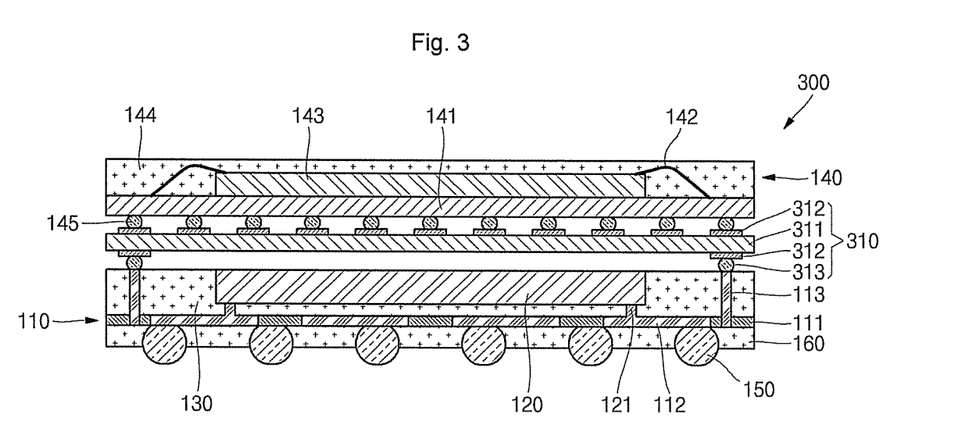
FIG. 3 shows a cross-sectional view of an example semiconductor device, in accordance with various aspects of the disclosure.

FIG. 3 shows a cross-sectional view of an example semiconductor device (300) in accordance with various aspects of the disclosure. The example semiconductor device 300 may share any or all characteristics with the example semiconductor device 100 shown in various stages in FIGS. 1a-1j and/or the example semiconductor device 200 shown in FIG. 2.

As illustrated in FIG. 3, the semiconductor device 300 may further comprise an interposer 310 (e.g., a bottom surface thereof) electrically connected to the BEOL layer 110 and positioned on the first encapsulant 130. A semiconductor package 140 may, for example, be electrically connected to a surface (e.g., a top surface) of the interposer 310.

For example, the interposer 310 may be electrically connected to the BEOL layer 110 through a conductive pillar 113. In addition, the interposer 310 may comprise a dielectric layer 311 formed on the surface of the first encapsulant 130 using, for example, silicon, polyimide or polyamide, a redistribution layer 312 formed on top and bottom surfaces of the dielectric layer 311 using, for example, copper or a copper alloy, and solder balls 313 electrically connecting the redistribution layer 312 and conductive pillars 113 to each other.

As described above, in the illustrated example semiconductor device 300, the interposer 310 is additionally used, thereby accommodating a large number of input/output terminals in the semiconductor package 140 and placement flexibility for such terminals.

This disclosure provides exemplary embodiments of various aspects of the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In summary, various aspects of the present disclosure provide a semiconductor device and a manufacturing method thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A semiconductor device comprising:
   a first redistribution layer comprising a first dielectric and a first conductive layer;
   a semiconductor die mounted to and electrically connected to an upper side of the first redistribution layer, where the semiconductor die comprises a die bonding pad on a lower die side of the semiconductor die and over the upper side of the first redistribution layer, and where the die bonding pad electrically connects the semiconductor die to the first conductive layer of the first redistribution layer;
   a lower encapsulant that covers a lower side of the first dielectric;
   a conductive pillar on the first redistribution layer, where a lower end of the conductive pillar is electrically connected to the first conductive layer of the first redistribution layer, and the lower end of the conductive pillar is vertically lower than the die bonding pad;
   an upper encapsulant that encapsulates the upper side of the first redistribution layer, the conductive pillar, and the semiconductor die, where the upper encapsulant comprises an upper encapsulant side facing away from the first redistribution layer and a lower encapsulant side facing toward the first redistribution layer;
   a second conductive layer on the upper encapsulant side, where the second conductive layer is electrically connected to the first conductive layer of the first redistribution layer through the conductive pillar; and
   a material underfilling directly vertically between the semiconductor die and the first redistribution layer,
   wherein:
      a first lateral side of the lower encapsulant is coplanar with a first lateral side of the upper encapsulant; and
      a first lateral side of the first redistribution layer is coplanar with the first lateral side of the upper encapsulant.

2. The semiconductor device of claim 1, comprising a plurality of metallic balls comprising solder and coupled to a lower side of the first redistribution layer.

3. The semiconductor device of claim 1, wherein the material comprises the upper encapsulant.

4. The semiconductor device of claim 1, wherein an uppermost end surface of the conductive pillar is coplanar with the upper encapsulant side.

5. The semiconductor device of claim 1, wherein at least a portion of the first conductive layer is laterally surrounded by the first dielectric.

6. The semiconductor device of claim 1, wherein the conductive pillar comprises a plating that is plated directly on the first conductive layer.

7. The semiconductor device of claim 1, wherein a metal of the conductive pillar extends vertically upward from the first conductive layer, through a center of the conductive pillar, to a position that is at least as high as an upper side of the semiconductor die.

8. A semiconductor device comprising:
   a first redistribution layer comprising a first dielectric and a first conductive layer;
   a semiconductor die mounted to and electrically connected to an upper side of the first redistribution layer, where the semiconductor die comprises a pad on a lower side of the semiconductor die and electrically connected to the upper side of the first redistribution layer, and where the lower side of the semiconductor die faces the upper side of the first redistribution layer;
   a lower encapsulant that covers a lower side of the first dielectric;
   a metallic ball comprising solder and coupled to a lower side of the first redistribution layer, where the metallic ball is partially embedded within the lower encapsulant, such that a portion of the metallic ball extends downward lower than a lower side of the lower encapsulant;
   a conductive pillar on the upper side of the first redistribution layer, where the conductive pillar is taller from the first redistribution layer than the semiconductor die;
   an upper encapsulant that encapsulates the upper side of the first redistribution layer, the conductive pillar, and the semiconductor die, where the upper encapsulant comprises an upper encapsulant side facing away from the first redistribution layer and a lower encapsulant side facing toward the first redistribution layer; and
   a second redistribution layer on the upper encapsulant side, where the second redistribution layer comprises a second conductive layer that is electrically connected to the first conductive layer of the first redistribution layer through the conductive pillar,
   wherein:
      a first lateral side of the lower encapsulant is coplanar with a first lateral side of the upper encapsulant; and
      a first lateral side of the first redistribution layer is coplanar with the first lateral side of the upper encapsulant.

9. The semiconductor device of claim 8, comprising an underfill material directly vertically between the semiconductor die and the first redistribution layer.

10. The semiconductor device of claim 8, wherein greater than 50% of the metallic ball is laterally surrounded by the lower encapsulant.

11. The semiconductor device of claim 8, wherein the metallic ball is positioned in an aperture of the lower encapsulant, and a maximum width of the aperture is at least as large as a maximum width of the metallic ball.

12. The semiconductor device of claim 8, wherein the second redistribution layer comprises a second dielectric.

13. The semiconductor device of claim 9, wherein the underfill material is different from the upper encapsulant.

14. The semiconductor device of claim 8, wherein an uppermost end surface of the conductive pillar is coplanar with the upper encapsulant side.

* * * * *